(12) United States Patent
Maeda et al.

(10) Patent No.: US 7,781,081 B2
(45) Date of Patent: Aug. 24, 2010

(54) MAGNETIC RECORDING MEDIUM, MANUFACTURING METHOD FOR THE MAGNETIC RECORDING MEDIUM, AND MAGNETIC READ/WRITE APPARATUS

(75) Inventors: Tomoyuki Maeda, Kawasaki (JP); Soichi Oikawa, Tokyo (JP); Takeshi Iwasaki, Yokohama (JP); Futoshi Nakamura, Ichikawa (JP); Hiroshi Sakai, Ichihara (JP); Kenji Shimizu, Ichihara (JP); Akira Sakawaki, Ichihara (JP)

(73) Assignees: Showa Denko K.K., Tokyo (JP); Kabushiki Kaisha Toshiba, Tokyo (JP)

( * ) Notice: Subject to any disclaimer, the term of this patent is extended or adjusted under 35 U.S.C. 154(b) by 1004 days.

(21) Appl. No.: 10/583,951

(22) PCT Filed: Dec. 24, 2004

(86) PCT No.: PCT/JP2004/019781

§ 371 (c)(1),
(2), (4) Date: Jun. 21, 2006

(87) PCT Pub. No.: WO2005/064597

PCT Pub. Date: Jul. 14, 2005

(65) Prior Publication Data

US 2007/0148500 A1 Jun. 28, 2007

Related U.S. Application Data

(60) Provisional application No. 60/533,250, filed on Dec. 31, 2003.

(30) Foreign Application Priority Data

Dec. 26, 2003 (JP) ............................. 2003-434826

(51) Int. Cl.
*G11B 5/66* (2006.01)
(52) U.S. Cl. .................................................. 428/836.2
(58) Field of Classification Search ....................... None
See application file for complete search history.

(56) References Cited

U.S. PATENT DOCUMENTS

| | | | | |
|---|---|---|---|---|
| 6,699,600 | B2 * | 3/2004 | Shimizu et al. | 428/828 |
| 7,192,664 | B1 * | 3/2007 | Wu et al. | 428/836.2 |
| 7,470,474 | B2 * | 12/2008 | Sakawaki et al. | 428/829 |
| 2001/0036564 | A1 | 11/2001 | Ohmori | |
| 2002/0015864 | A1 | 2/2002 | Maesaka et al. | |
| 2002/0187368 | A1 | 12/2002 | Senzaki et al. | |
| 2004/0191576 | A1 | 9/2004 | Shimizu et al. | |

FOREIGN PATENT DOCUMENTS

CN 1115457 A 1/1996

(Continued)

*Primary Examiner*—Holly Rickman
(74) *Attorney, Agent, or Firm*—Sughrue Mion, PLLC

(57) ABSTRACT

A magnetic recording medium 62 wherein a substrate 11, undercoating layers 13 and 14 formed on the substrate 11, and a magnetic recording layer 15, which include the magnetic crystal grain and the grain boundary field which encloses magnetic crystal grains, are included. The grain boundary field includes Ti oxide, and the ratio of the substance amount of the Ti oxide in the magnetic recording layer 15 is 5 mol % or more and 15 mol % or less, and the Ti oxide includes at least TiO and/or $Ti_2O_3$s.

16 Claims, 5 Drawing Sheets

FOREIGN PATENT DOCUMENTS

| | | |
|---|---|---|
| EP | 0 673 033 A2 | 9/1995 |
| JP | 9-102419 A | 4/1997 |
| JP | 9-204651 A | 8/1997 |
| JP | 2001-43526 A | 2/2001 |
| JP | 2001-291230 A | 10/2001 |
| JP | 2002-25032 A | 1/2002 |
| JP | 2002-83411 A | 3/2002 |
| JP | 2002-222517 A | 8/2002 |
| JP | 2002-342908 A | 11/2002 |
| JP | 2002-358615 A | 12/2002 |
| JP | 2003-272120 A | 9/2003 |
| JP | 2003-313659 A | 11/2003 |

* cited by examiner

MAGNETIC RECORDING MEDIUM, MANUFACTURING METHOD FOR THE MAGNETIC RECORDING MEDIUM, AND MAGNETIC READ/WRITE APPARATUS

CROSS-REFERENCE TO RELATED APPLICATION

This application claims the benefit pursuant to 35 U.S.C. §119(e)(1) of U.S. Provisional Application, No. 60/533,250 filed Dec. 31, 2003.

TECHNICAL FIELD

The present invention relates to a magnetic recording medium using a magnetic recording technology, which can be used for a hard disk drive and the like, to a manufacturing method for the same, and to a magnetic read/write apparatus.

BACKGROUND ART

A magnetic recording device (HDD), which performs recording and reproduction (write and read) of information and is mainly used for computers, has large capacity, low price, good data access speed, reliability of data-storage and the like, and therefore, the scope of application of the magnetic recording device has been expanding gradually in recent years. The magnetic recording device is used in various fields, such as household videotape recorders and players, an audiovisual apparatuses, and in-vehicle navigation systems. In accordance with such an increase of usable range of HDD, the demand for obtaining the record capacity having high density is also increased, and as a result, development of HDD for obtaining higher density is thriving in recent years.

An in-plane magnetic recording system is a system used for the magnetic read/write apparatus which is commercially available at present. In the system, magnetic crystal grains, which are comprised in a magnetic recording layer used for recording the information, have a magnetic easy axis thereof in parallel to the substrate. Here, the magnetic easy axis means an axis to which the direction of magnetization tends to be oriented easily. For example, in the case of a Co-based alloy, a magnetic easy axis thereof is the "c" axis of the hcp structure of Co. The in-plane magnetic recording medium has an ability that read/write characteristic thereof degrade due to so-called thermal fluctuation effects, wherein a magnetization reversal unit diameter of the magnetic layer is too decreased corresponding to decreased record bit which is made small in order to increase a recording density, and as a result, the information recorded therein is thermally lost. Furthermore, when the record density is increased, noise which is generated from the medium tends to increase under the influence of the demagnetizing field generated in the boundary area between record bits.

On the other hand, there is a so-called perpendicular magnetic recording system in which a magnetic easy axis in a magnetic recording layer is oriented to a direction which is nearly perpendicular to a substrate. In this system, the influence of demagnetizing field between record bits is small even while recording density of the medium is increased, and the system is magnetostatically stable even when recording density is increased. For this reason, the perpendicular magnetic recording system has been of great interest in recent years as a technology which can be used instead of the in-plane recording system. In general, the perpendicular magnetic recording medium comprises a substrate, an orientation controlling undercoating layer for obtaining the orientation of a magnetic recording layer, the magnetic recording layer which is formed with a hard magnetic material, and a protective layer which protects the surface of the magnetic recording layer. A soft magnetic back layer may be provided between the substrate and the undercoating layer, wherein the back layer functions for concentrating the magnetic flux which is generated from a magnetic head at the time of recording.

The perpendicular magnetic recording medium is also required to realize a low noise while maintaining a heat stability, in order to establish a high record density thereof.

As a method generally used for decreasing noise, there is a method in which size of the magnetic crystal grains itself included in the recording layer is made fine. For example, CoCr based magnetic recording layer which is widely used in general is explained below. Magnetic grains for the magnetic layer are made fine, due to a segregation of nonmagnetic Cr in the grain boundary wherein the segregation is caused by adding Ta and B or by heating to a suitable temperature. However, in the case of a perpendicular magnetic recording medium, magnetic interaction between grains in the perpendicular magnetic recording medium is decreased insufficiently, since it is not sufficient to achieve the fine magnetic grains caused by Cr segregation and the spatial separation between magnetic crystal grains is imperfect. Therefore, the perpendicular magnetic recording medium has a problem that the transition noise between record bits decreases insufficiently.

As a method for reducing the aforementioned magnetic interaction, there is a method in which $SiO_2$ is added to a recording layer to obtain a magnetic recording layer having a granular structure wherein magnetic crystal grains were enclosed with an $SiO_2$ additive. For example, please refer to Japanese Unexamined Patent Application, First Publication No. 2002-83411.

Moreover, there is a method in which $TiO_2$ is added to a recording layer to obtain a magnetic recording layer having a granular structure in which magnetic crystal grains were enclosed with the $TiO_2$ additive. For example, please refer to Japanese Unexamined Patent Application, First Publication No. 2001-43526.

However, there is a problem in that $SiO_2$ has a slow diffusion velocity in a film and therefore it cannot fully deposit in the magnetic crystal grain boundary, and for this reason, a part of $SiO_2$ which cannot deposit forms a supersaturated solid solution with the magnetic crystal grains, and a crystallinity and an orientation of the magnetic crystal grains cause disorder or distortion, and as a result, the signal to noise ratio (SNR) of read/write characteristic (R/W) is reduced.

Moreover, there is a problem in that $TiO_2$ has high heat stability and therefore it does not fully deposit at the magnetic crystal grain boundary, and for this reason, a part of $TiO_2$ forms a supersaturated solid solution with the magnetic crystal grains, and a crystallinity and orientation of the magnetic crystal grains causes disorder or distortion, and SNR of the R/W characteristic is reduced.

DISCLOSURE OF INVENTION

The present invention was achieved based on the aforementioned circumstances, and an object of the present invention is to provide a magnetic recording medium and a magnetic recording apparatus using the magnetic recording medium, wherein the medium has excellent SNR characteristics and can conduct high density recording, by providing fine particle diameter to the magnetic crystal grains without forming disorder or distortion of crystallinity and orientation of the magnetic crystal grains.

In order to achieve the aforementioned object, the present invention provide the following media and the like.

(1) A magnetic recording medium, comprises: a substrate, at least one of undercoating layer formed on the substrate, a magnetic recording layer which is formed on the undercoating layer and includes a magnetic crystal grains and a grain boundary field which encloses the magnetic crystal grain; wherein
the grain boundary field includes Ti oxide, and the ratio of the substance amount of the Ti oxide in the magnetic recording layer is 5 mol % or more and 15 mol % or less, and the Ti oxide comprises at least TiO and/or $Ti_2O_3$.

(2) The magnetic recording medium according to (1), wherein the Ti oxide comprises $TiO_2$, and the component ratio of the $TiO_2$ in the Ti oxide is 90 mol % or less.

(3) The magnetic recording medium according to (1) or (2), wherein the magnetic crystal grain comprises Pt and Cr in addition to Co as a main component; and an orientation of a magnetic easy axis of the grain is perpendicular to the substrate.

(4) The magnetic recording medium according to any one of (1) to (3), wherein at least one layer contained the undercoating layer comprises nonmagnetic crystal grains which contain at least one element selected from the group consisting of Ru, Rh, Pt, and Pd as an main component.

(5) The magnetic recording medium according to any one of (1) to (4), wherein the undercoating layer comprises: nonmagnetic crystal grains, which contains at least one element selected from the group consisting of Ru, Rh, Pt, and Pd as an main component; and a grain boundary field, which encloses the nonmagnetic crystal grains and includes an oxide of at least one element selected from the group consisting of Si, Cr, and Ti.

(6) The magnetic recording medium according to any one of (1) to (5), wherein the ratio of the substance amount of the oxide in the undercoating layer is 1 mol % or more and 15 mol % or less.

(7) The magnetic recording medium according to any one of (1) to (6), wherein the oxide contained in the undercoating layer is Ti oxide, and the Ti oxide comprises at least TiO and/or $Ti_2O_3$.

(8) The magnetic recording medium according to any one of (1) to (7), wherein the undercoating layer comprises $TiO_2$ as at least one of the Ti oxide, and the ratio of the $TiO_2$ in the Ti oxide is 90 mol % or less.

(9) A manufacturing method of a magnetic recording medium, comprises the steps of:
preparing a substrate on which an undercoating layer is formed; and
vapor-depositing a material for magnetic crystal grain and a material comprising TiO and/or $Ti_2O_3$ to form a magnetic recording layer which includes magnetic crystal grains and a grain boundary field, which encloses the magnetic crystal grains.

(10) The manufacturing method of a magnetic recording medium according to (9), wherein the grain boundary field in the magnetic recording layer includes Ti oxide, and the ratio of the substance amount of the Ti oxide in the magnetic recording layer is 5 mol % or more and 15 mol % or less.

(11) The manufacturing method of a magnetic recording medium according to (9) or (10), wherein the Ti oxide in the magnetic recording layer comprises $TiO_2$, and the component ratio of the $TiO_2$ in the Ti oxide is 90 mol % or less.

(12) The manufacturing method of a magnetic recording medium according to any one of (9) to (11), wherein the magnetic crystal grains in the magnetic recording layer comprise Pt and Cr in addition to Co as a main component; and an orientation of a magnetic easy axis of the grain is perpendicular to the substrate.

(13) The manufacturing method of a magnetic recording medium according to any one of (9) to (12), wherein at least one layer contained in the undercoating layer includes nonmagnetic crystal grains which contain at least one element selected from the group consisting of Ru, Rh, Pt, and Pd as a main component.

(14) The manufacturing method of a magnetic recording medium according to any one of (9) to (13), wherein at least one layer contained in the undercoating layer includes: nonmagnetic crystal grains, which contains at least one element selected from the group consisting of Ru, Rh, Pt, and Pd as a main component; and a grain boundary field, which encloses the nonmagnetic crystal grains and includes an oxide of at least one element selected from the group consisting of Si, Cr, and T.

(15) The manufacturing method of a magnetic recording medium according to any one of (9) to (14), wherein the ratio of the substance amount of the oxide in the undercoating layer is 1 mol % or more and 15 mol % or less.

(16) The manufacturing method of a magnetic recording medium according to any one of (9) to (15), wherein the oxide contained in the undercoating layer is Ti oxide, and the Ti oxide comprises TiO and/or $Ti_2O_3$.

(17) The manufacturing method of a magnetic recording medium according to any one of (9) to (16), wherein the oxide contained in the undercoating layer comprises $TiO_2$ as at least one of the Ti oxide, and the ratio of the $TiO_2$ component in the Ti oxide is 90 mol % or less.

(18) A magnetic read/write apparatus comprising a read and write head and the magnetic recording medium according to any one of (1) to (8).

(19) The magnetic read and write apparatus according to (18), wherein the read and write head is a single pole type recording head.

In the present invention, TiO and/or $Ti_2O_3$ are used as additives for dividing magnetic crystal grains and providing fine size thereto.

The presence of Ti oxide such as TiO, $Ti_2O_3$, $TiO_2$ and the like which are described from an oxide having a low oxidation number are known. Among these Ti oxides, a phase of $TiO_2$ having an oxidation number 4 is thermodynamically most stable under normal temperature and atmosphere. TiO and $Ti_2O_3$ which have small oxidation number have unstable phases as compared with the aforementioned $TiO_2$. Therefore, in the atmosphere in which oxygen exists, a chemical reaction in the following reaction formula proceeds from left to right.

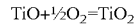

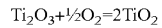

When an oxide having a small oxidation number such as TiO and/or $Ti_2O_3$ is provided as an additive for a vapor deposition together with a material for a magnetic crystal grain, the oxide is deposited to obtain oxygen due to the influence of residual oxygen and the like comprised in the vapor deposition atmosphere, and $TiO_2$ is formed in the grain boundary. Due to the effect, the driving force for diffusing TiO and/or $Ti_2O_3$ into the magnetic crystal grain boundary can increase remarkably. Accordingly, as compared with thermodynamically stable oxides such as $SiO_2$ and $TiO_2$ which have been used as conventional additives, TiO and $Ti_2O_3$ can be diffused in a grain boundary at high speed and can deposit sufficiently in the grain boundary of the magnetic crystal grains without remaining in the magnetic crystal grain unlike $SiO_2$ and the like. In this way, the present invention can provide the granular structure of fine grains wherein it can be formed without forming a supersaturated solid solution of the magnetic crystal grains, due to the use of TiO and/or $Ti_2O_3$ as additives for dividing magnetic crystal grains and providing fine grain size of magnetic crystal grains.

The ratio of the substance amount of the Ti oxide, which also includes $TiO_2$ in addition to TiO and/or $Ti_2O_3$, in the magnetic recording layer is preferably 5 mol % or more and 15 mol % or less, and more preferably 7 mol % or more and 12 mol % or less. The ratio less than 5 mol % is not preferable since there is a tendency that improving effects of SNR of the R/W characteristic cannot be obtained remarkably. The ratio more than 15 mol % is also not preferable since there is a tendency that the crystal axis orientation is influenced unsuitably and reproduction output of the R/W characteristic decreases.

Here, the ratio of the substance amount of the Ti oxide in the magnetic layer can be analyzed with, for example, Auger electron spectroscopy (AES), X-ray photoelectron spectroscopy (XPS), energy dispersion type X-ray spectroscopic analysis method (TEM-EDX) using a transmission electron microscope, and the like.

The ratio of $TiO_2$ component in the Ti oxide in the magnetic layer is preferably 90 mol % or less, and more preferably it is 40 mol % or more and 60 mol % or less. As described above, TiO and $Ti_2O_3$ tend to be oxidized when the film is formed, and therefore, considerable amounts of $TiO_2$ component exist in the grain boundary field of the magnetic layer, in spite of adding TiO and $Ti_2O_3$ as vapor deposition materials. If the amounts of $TiO_2$ component added exceed 90 mol %, excellent improving effects of SNR of the R/W characteristic cannot be obtained as compared with a case wherein merely $TiO_2$ is added, and it is not preferable.

The ratio of $TiO_2$ component in the Ti oxide can be analyzed with, for example, XPS, extended X-ray absorption fine structure (EXAFS), X-ray absorption near-edge fine structure (XANES) and the like.

CoPtCr based alloy, which has been used as a material for the magnetic crystal grains, is also used suitably for the magnetic recording medium of the present invention, since CoPtCr-based alloy has high crystal magnetic anisotropic energy and therefore the thermal fluctuation resistance thereof is high. Furthermore, additional elements such as Ta, Cu, and B, can also be added to the alloy if necessary, in order to improve the magnetic property. More preferably, CoCrPt, CoCrPtB, CoCrPtTa, CoCrPtNd, CoCrPtCu, and the like can be used as the material.

The magnetic recording layer of the present invention may have a multilayer structure of two or more layers if necessary. In such a case, it is sufficient for the present invention that at least one layer included in the multilayer be a layer having the characteristics as described above.

Ru, Rh, Pt, Pd, Ti, and Ir which can be used for the undercoating layer of the magnetic recording layer has a good lattice matching with the aforementioned CoPtCr based alloy, and therefore, these elements can improve the degree of the crystal orientation of the magnetic recording layer when they are used.

The aforementioned undercoating layer may be a laminated layer of two or more if necessary.

The R/W characteristics of the magnetic recording medium can be further increased when an oxide is added to the undercoating layer in order to form a granular structure. Preferable examples of the oxide added to the undercoating layer include those as described above, that is, oxides of Si, Cr, Ti, and the like, and oxide of Ti including TiO and/or $Ti_2O_3$ is particularly preferable since the R/W characteristics are further improved when it is used.

The amount of the aforementioned oxide added to the undercoating layer is preferably 1 mol % or more and 15 or less mol %, and more preferably 3 mol % or more and 10 mol % or less. When it is less than 1 mol %, excellent improved effects of SNR in the R/W characteristic tend not to be obtained, and it is not preferable. When it is more than 15 mol %, the degree of the orientation of the magnetic recording layer tends to deteriorate and SNR of the R/W characteristic also tends to deteriorate, and is therefore not preferable.

When the ratio of $TiO_2$ component in the oxide comprised in the undercoating layer is 90 mol % or less, improving effect of SNR of the R/W characteristics can be obtained, and therefore it is preferable. When the ratio is 40 mol % or more and 60 mol % or less, it is more preferable since the improving effects of SNR of the R/W characteristics is even higher.

The undercoating layer which has the granular structure may have a multiple layered structure of two or more layers, and the undercoating layer may be a layer which does not contact with the magnetic recording layer directly.

By providing a soft magnetic layer having high magnetic permeability between the aforementioned undercoating layer and the substrate, so-called double layered perpendicular magnetic recording medium, in which the perpendicular magnetic recording layer is provide above the soft magnetic layer, is prepared. The soft magnetic layer of the double layered medium carries one function of the magnetic head, such that record magnetic field from the magnetic head, for example, from the single magnetic pole head, is carried horizontally in the layer to the side of the magnetic head for conducting reflux, when magnetization of the perpendicular magnetic recording layer is conducted. The soft magnetic layer can function for providing sufficient and sharp perpendicular magnetic field to the recording layer in the magnetic field and improving the read/write efficiency.

Examples of such a soft magnetic layer include layers of CoZrNb, FeSiAl, FeTaC, CoTaC, NiFe, Fe, FeCoB, FeCoN, and FeTaN.

Moreover, a bias applying layer, such as a inplane hard magnetic film and an antiferromagnetic film, can be prepared between the soft magnetic layer and the substrate. The soft magnetic layer can form a magnetic domain easily, and spike-like noise is generated from the magnetic domain. Therefore, due to application of one way direction of a magnetic field to the radius direction of the bias applying layer, a bias magnetic field is applied to the soft magnetic layer formed on the bias applying layer, and generation of a magnetic wall can be prevented. It is also possible to provide the bias applying layer as a laminated structure so that anisotropy is distributed finely, and a big magnetic domain is difficult to form. Examples of materials for the bias applying layer include CoCrPt, CoCrPtB, CoCrPtTa, FePt, CoCrPtTaNd, CoSm, CoPt, CoPtO, CoPtCrO, CoPt—$SiO_2$, CoCrPt—$SiO_2$, and CoCrPtO—$SiO_2$.

Examples of the substrate of the present invention include a glass substrate, an Al-based alloy substrate, and a Si single crystal substrate wherein the surface thereof is oxidized, ceramics, plastics, and the like. Furthermore, it is also possible to use a substrate wherein the nonmagnetic surface of the aforementioned substrate is plated with, for example, a NiP alloy and the like, and such a substrate can be expected to have the similar effect with those of the aforementioned substrate.

A protective layer may be provided on the magnetic recording layer. Examples of the protective layer include those of C, diamond-like carbon (DLC), $SiN_X$, $SiO_X$, and $CN_X$. The X is a number suitably selected optionally.

Examples of the sputtering method include a mono-target sputtering method which can use a composite target and a multiple-target simultaneous sputtering method wherein targets for each substance can be used. Moreover, oxygen may be added to a sputtering gas such as Ar, if necessary.

The magnetic recording medium of the present invention make it possible to make the particle diameter of the magnetic crystal grains smaller without disturbing crystallinity and orientation of the magnetic crystal grains, conduct high density recording, and exhibit excellent SNR characteristics.

BEST MODE FOR CARRYING OUT THE INVENTION

The preferred embodiments of the present invention will be described below with reference to drawings.

First Embodiment

Figure 1:
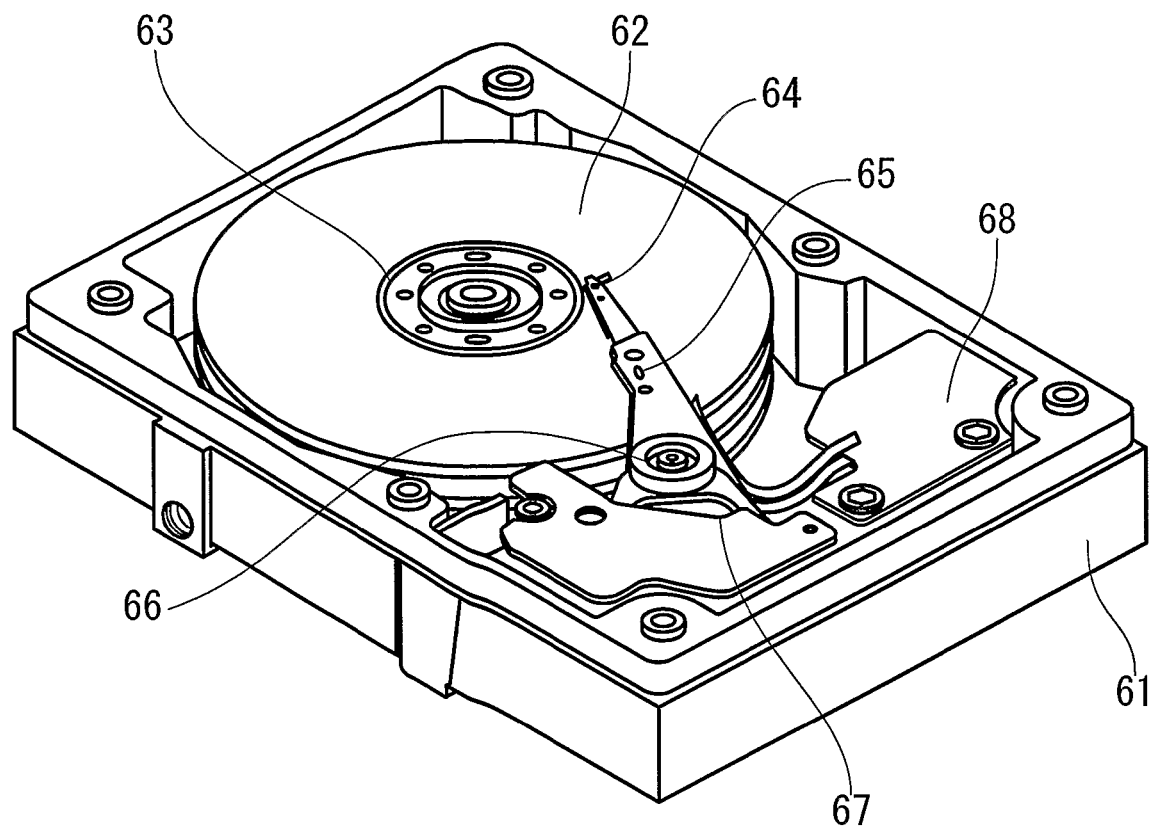
FIG. 1 is a perspective view wherein one part of an example of the magnetic recording read/write apparatus of the first embodiment of the present invention is exploded.
Figure 2:
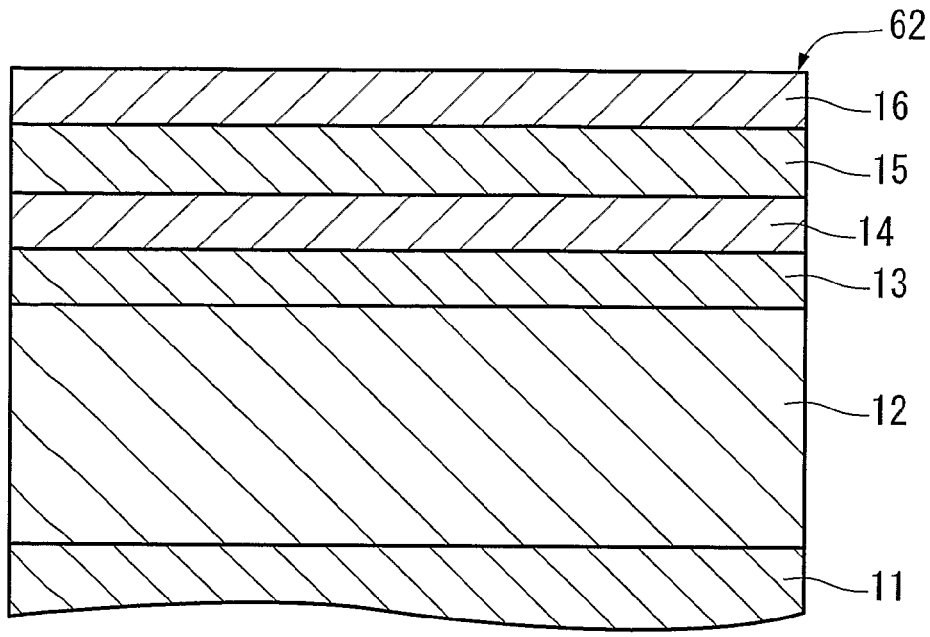
FIG. 2 is a typical sectional view which shows a configuration of an example of the magnetic disk (magnetic recording medium) equipped with the magnetic recording read/write apparatus shown in FIG. 1.
Figure 3:
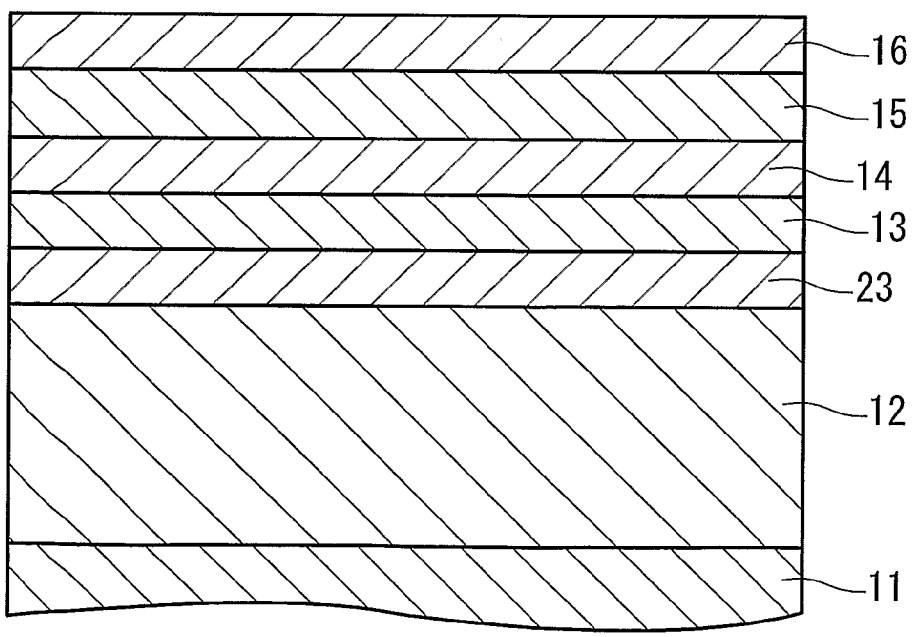
FIG. 3 is a typical sectional view which shows a configuration of another example of the magnetic disk (magnetic recording medium) equipped with the magnetic recording read/write apparatus shown in FIG. 1.
Figure 4:
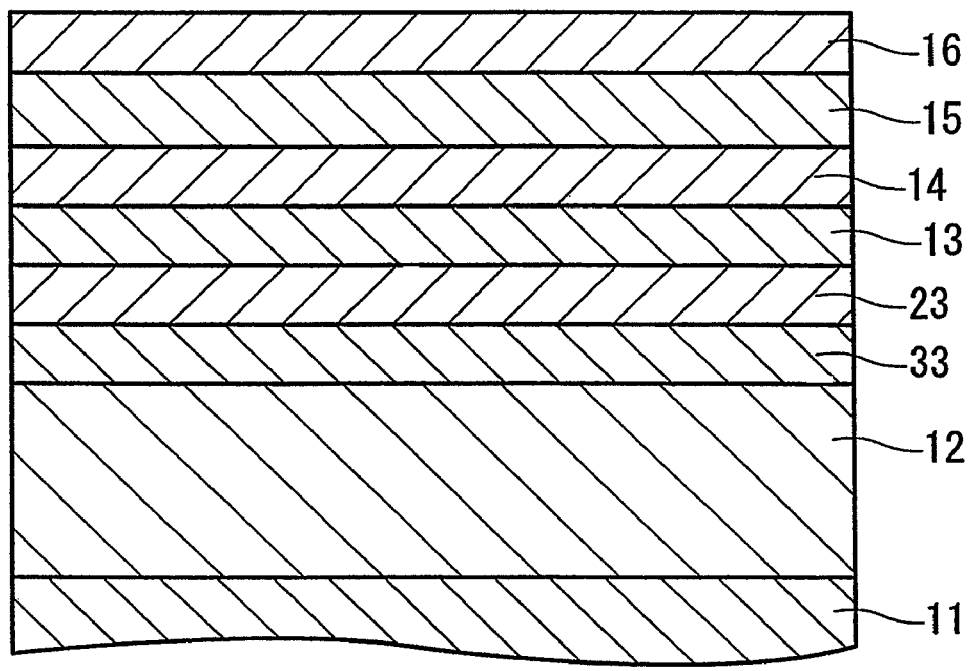
FIG. 4 is a typical sectional view which shows a configuration of another example of the magnetic disk (magnetic recording medium) equipped with the magnetic recording read/write apparatus shown in FIG. 1.

FIG. 1 is a perspective view, wherein one example of the magnetic recording read/write apparatus which is the first embodiment of the present invention is partially disassembled. FIG. 2 is a typical sectional view, wherein one example of the magnetic disk (magnetic recording medium) equipped with the magnetic recording read/write apparatus of FIG. 1 is shown. FIG. 3 is a typical sectional view which shows another example of the magnetic disk (magnetic recording medium). FIG. 4 is a typical sectional view which shows another example of the magnetic disk (magnetic recording medium).

As shown in FIG. 1, the magnetic recording read/write apparatus 60 of the present embodiment comprises a case 61, which has a shape of a rectangle box having an upper opening surface and a not-illustrated top cover for occluding the upper end opening of the case 61 wherein it is screwed to the case 61 with plural screws.

In the case 61, there are a magnetic disk 62 which is a magnetic recording medium according to the present invention; a spindle motor 63 as a driving means for supporting and rotating the magnetic disk 62; a magnetic head 64 which conducts recording and reproducing of a magnetic signal regarding the magnetic disk 62; a head actuator 65 which has a suspension equipped with the magnetic head 64 on the top thereof and which can support the magnetic head 64 movably with respect to the magnetic disk 62; a rotation axis 66 which can support the head actuator 65 rotationally; a voice coil motor 67 which rotates and determines the position of the head actuator 65 via the rotation axis 66; and a head amplifier circuit 68.

As shown in FIG. 2, the magnetic disk 62 (magnetic recording medium) comprises a substrate 11; a soft magnetic layer 12 laminated on the substrate 11; a second undercoating layer 13 (undercoating layer) laminated on the soft magnetic layer 12; a first undercoating layer 14 (undercoating layer) laminated on the second undercoating layer 13; a magnetic recording layer 15 laminated on the first undercoating layer 14; and a protective layer 16 laminated on the magnetic recording layer 15.

The substrate 11 can be formed with a glass substrate, an Al based alloy substrate, a Si single crystal substrate wherein the surface thereof is oxidized, a ceramic, a plastic or the like. Plating of a NiP alloy and the like may be provided on the substrate 11.

As the soft magnetic layer 12, those having high magnetic permeability is preferable. Examples of materials for forming the layer include CoZrNb, FeSiAl, FeTaC, CoTaC, NiFe, Fe, FeCoB, FeCoN, and FeTaN. The thickness of the soft magnetic layer 12 is preferably in the range of 50 to 300 nm.

By providing the soft magnetic layer 12 between the second undercoating layer 13 and the substrate 11, a so-called double layered perpendicular magnetic recording medium is formed in which the perpendicular magnetic recording layer is comprised on the soft magnetic layer 12. The soft magnetic layer 12 is bearing a part of function of the magnetic head, such that the record magnetic field from the single magnetic pole type head is circulated by being sent horizontally in the layer to the magnetic head side.

The first undercoating layer 14 and the second undercoating layer 13 contain nonmagnetic crystal grains which include as an main component at least one kind of element selected from Ru, Rh, Pt, and Pd. It is preferable that materials for the second undercoating layer 13 and the first undercoating layer 14 be different from each other. The thickness of the first undercoating layer 14 is preferably in the range of 3 to 20 nm, and the thickness of the second undercoating layer 13 is preferably in the range of 3 to 20 nm.

As shown in FIG. 3, the third undercoating layer 23 may be provided between the second undercoating layer 13 and the soft magnetic layer 12. Furthermore, as shown in FIG. 4, the third undercoating layer 23 and the fourth undercoating layer 33 may be provided between the second undercoating layer 13 and the soft magnetic layer 12.

The magnetic recording layer 15 is structured such that the layer comprises the magnetic crystal grains and the grain boundary field which surrounds the magnetic crystal grains. The thickness of the magnetic recording layer 15 is in the range of 3 to 20 nm. The magnetic crystal grain comprises Co as a main component, and Pt and Cr; and a magnetic easy axis thereof is oriented perpendicular to the substrate. CoPtCr based alloy, which forms the magnetic crystal grains, is suitably used for the magnetic recording medium of the present invention, since the alloy has high crystal magnetic anisotropy energy and therefore has high thermal fluctuation resistance. It is also possible to add additional elements such as Ta, Cu, and B, to the alloy if necessary, in order to improve the magnetic property. More preferably, CoCrPt, CoCrPtB, CoCrPtTa, CoCrPtNd, CoCrPtCu, and the like can be used as the additional elements.

The grain boundary field contains at least TiO and/or $Ti_2O_3$, and $TiO_2$ is also contained. The ratio of the substance amount of these Ti oxide in the magnetic recording layer 15 is provided as 5 mol % or more and 15 mol % or less. The ratio of $TiO_2$ component in the Ti oxide is provided as 90 mol % or less.

Due to use of oxide which has a small oxidation number such as TiO and/or $Ti_2O_3$ as a grain boundary component, $TiO_2$ which has excellent heat stability as compared with TiO and $Ti_2O_3$ is formed in the grain boundary. According to the effect, TiO and $Ti_2O_3$ can diffuse in the magnetic grain boundary at high speed. Thereby, the grain boundary field can form the granular structure having a fine structure, without forming a supersaturated solid solution with the magnetic crystal grains in the grain boundary area.

The ratio of the substance amount of Ti oxide which is less than 5 mol % is not preferable, since there is a tendency that improving effects of SNR of the R/W characteristic can not be obtained remarkably. The ratio of the substance amount of Ti oxide more than 15 mol % is also not preferable, since there is a tendency that the crystal axis orientation of the magnetic crystal grain to be influenced unsuitably and reproduction-output of the R/W characteristics decreases unsuitably.

Moreover, when the ratio of $TiO_2$ component in the Ti oxide exceeds 90 mol %, excellent improving effect of SNR of the R/W characteristics is not obtained as compared with the case where only $TiO_2$ is used and therefore it is not desirable.

The ratio of the substance amount of the Ti oxide in the magnetic layer can be analyzed with, for example, Auger electron spectroscopy (AES), X-ray photoelectron spectroscopy (XPS), energy dispersion type X-ray spectroscopic analysis method (TEM-EDX) using the transmission electron microscope, and the like. The ratio of $TiO_2$ component can be analyzed with, for example, XPS, extended X-ray absorption fine structure (EXAFS), X-ray absorption near-edge fine structure (XANES) and the like.

The protective layer 16 is formed with, for example, C, diamond-like carbon (DLC), $SiN_X$, $SiO_X$, $CN_X$, and the like. By providing the protective layer 16, the magnetic recording layer 15 can be protected mechanically.

When the magnetic disk of the present embodiment is manufactured, it is preferable that a sputtering method be used for forming each layer of the disk such as the magnetic recording layer 15. In particular, a mono-target sputtering method which uses a composite target and a multiple-target simultaneous sputtering method wherein as a target for each substance can be used are used preferably. Oxygen may be added to the sputtering gas such as Ar, if necessary.

SECOND EMBODIMENT

Figure 5:
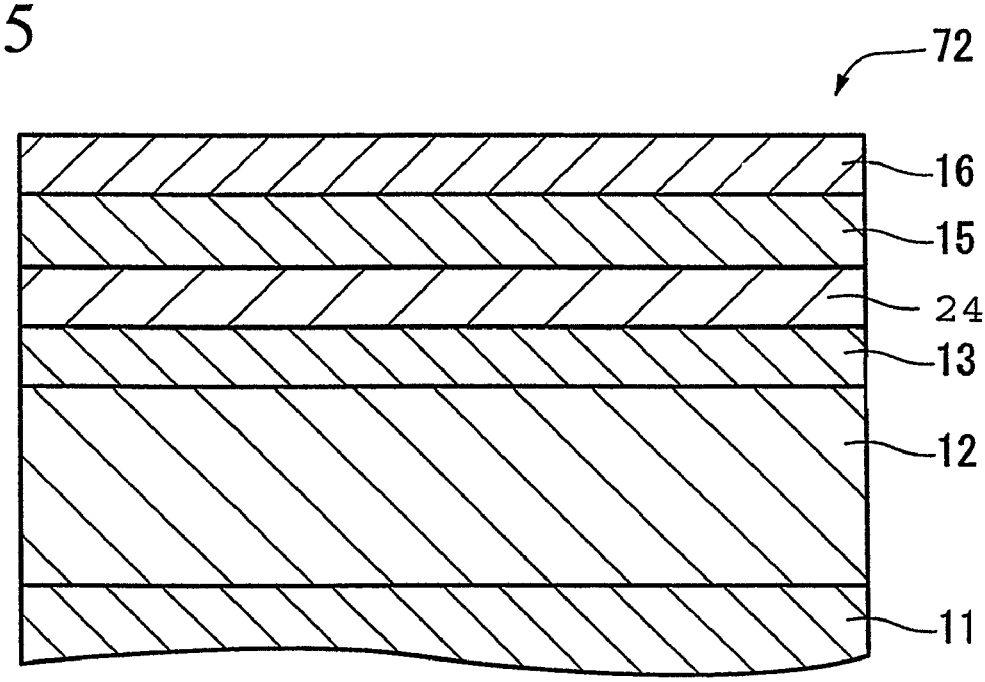
FIG. 5 is a typical sectional view which shows a configuration of a magnetic disk (magnetic recording medium) of the second embodiment of the present invention.

FIG. 5 is a typical sectional view of the magnetic disk 72 (magnetic recording medium) which is the second embodiment of the present invention.

The magnetic disk 72 (magnetic recording medium) of the present embodiment includes a substrate 11; a soft magnetic layer 12 laminated on the substrate 11; a second undercoating layer (undercoating layer) 13 laminated on the soft magnetic layer 12; a first undercoating layer 24 (undercoating layer) laminated on the second undercoating layer 13; a magnetic recording layer 15 laminated on the first undercoating layer 24; and a protective layer 16 laminated on the magnetic recording layer 15.

The difference between the present embodiment and the first embodiment is that the first undercoating layer 24 has a granular structure. Therefore, the substrate 11, the soft magnetic layer 12, the second undercoating layer 13, the magnetic recording layer 15, and the protective layer 16 of the present embodiment are the same as each structural component having the same number explained in the first embodiment. Therefore, explanations of these structural components are omitted.

The first undercoating layer 24 which is comprised in the magnetic disk 72 (magnetic recording medium) of the present embodiment includes nonmagnetic crystal grains which include at least on kind of element selected from the group consisting of Ru, Rh, Pt, and Pd as a main component, and the grain boundary field which encloses the nonmagnetic crystal grains. The grain boundary field comprises oxide of at least one kind of element selected from the group consisting of Si, Cr, and Ti.

In this way, the R/W characteristic of the magnetic recording medium can be further improved by adding such an oxide to the undercoating layer to form a granular structure. The desirable oxide added is a oxide of Si, Cr, and/or Ti as described above. Especially, when the Ti oxide containing TiO and/or $Ti_2O_3$ is used, the R/W characteristic can be further improved.

The amount of the aforementioned oxide which can be added to the first undercoating layer 24 is preferably 1 mol % or more and 15 mol % or less, and is more preferably 3 mol % or more and 10 mol % or less. When the amount is less than 1 mol %, excellent improving effects of SNR of the R/W characteristic tends not to be obtained, and it is not preferable. When the amount is more than 15 mol %, the degree of the orientation of the magnetic recording layer tends to deteriorate and SNR of the R/W characteristic also tends to deteriorate, and this is therefore not preferable.

When the ratio of $TiO_2$ component in the Ti oxide is 90 mol % or less, improving effect with respect to SNR of the R/W characteristic can be preferably obtained. The ratio of $TiO_2$ component which is 40 mol % or more and 60 mol % or less is more preferable since the improved effect of SNR of the R/W characteristic is even higher.

EXAMPLES

Hereinafter, the present invention is more concretely explained with examples.

Example 1

A nonmagnetic glass substrate having a hard disk form and 2.5 inches was prepared.

Next, an inside of a vacuum chamber of a sputtering device was evacuated until it was $2 \times 10^{-5}$ Pa or less. Then, the pressure inside the chamber was made 0.67 Pa under an atmosphere of Ar, and a soft magnetic layer which consists of $Co_{84}Zr_6Nb_{10}$ and has a thickness of 200 nm was formed on the substrate by using a target of $Co_{84}Zr_6Nb_{10}$. Next, a second undercoating layer which is a layer of Ta having a thickness of 8 nm was formed on the soft magnetic layer by using a target of Ta. Then, the pressure inside the chamber was changed into 3 Pa under the atmosphere of Ar, and a first undercoating layer which was a layer of Ru having a thickness of 15 nm was formed on the second undercoating layer by using a target of Ru.

Next, a magnetic recording layer having a thickness of 13 nm was formed thereon using a composite target as a material for magnetic crystal grains, wherein the target was obtained by mixing TiO powder and CoCrPt alloy powder containing 10 at % of Co and 14 at % of Cr. Furthermore, a protective layer which was composed of C (carbon) and having a thickness of 5 nm was formed on the recording layer under the condition of a pressure of 0.67 Pa and an atmosphere of Ar. After the protective layer was formed, a perfluoropolyether (PFPE) lubricant was applied on the protective layer surface to have a thickness of 13 Å (1.3 nm) with a dipping method, and as a result, a magnetic recording medium as shown in FIG. 2 was obtained.

Input electric power to each target was set to 1,000 W. Moreover, composition of the magnetic recording layer was changed, such that "x" is changed from 0 to 0.2 when the molar ratio of CoCrPt alloy to TiO was expressed as $(1-x):x$. The composition was controlled by changing the mixture ratio of the CoCrPt alloy powder to TiO powder at the time of the production of the composite target. A magnetic recording medium wherein $SiO_2$ and $TiO_2$ was used instead of TiO was produced for comparison. Furthermore, a magnetic recording medium was also produced wherein the component ratio of $(TiO+Ti_2O_3):TiO_2$ in the magnetic layer was changed by adding oxygen into the sputtering gas (Ar) at the time of forming the magnetic recording layer.

The R/W characteristics of the obtained magnetic recording media were evaluated using the spin stand. A head wherein a single magnetic pole type head having a record track width of 0.3 μm and a MR head having a reproduction track width of 0.2 μm were combined, was used as a magnetic head. Measurement condition was such that the disks were rotated at 4,200 rpm and measurement was performed on the fixed position at the radius position of 20 mm.

A signal noise ratio (SNRm) (here, S means an output of track recording density of 119 kfci and Nm means a root mean square (rms) value at 716 kfci) of the differential wave form after passing through the differential circuit as a SNR medium was evaluated, and a half width value dPW50 of the differential wave form was also evaluated as an index of record resolution.

Composition of each oxide in the magnetic recording layer was analyzed using TEM-EDX wherein acceleration voltage thereof was 400 kV. The ratio of TiO, $Ti_2O_3$, and $TiO_2$ in the magnetic recording layer was identified by a comparison of integrated intensities of the peaks which existed in the energy positions corresponding to each phase obtained by XPS.

The dPW50 values and the SNRm values when each additive was charged under the condition of x=0.08 are shown in the following Table 1.

TABLE 1

| Materials added | SNRm (dB) | dPW50 (nm) |
|---|---|---|
| $SiO_2$ | 17.1 | 90 |
| $TiO_2$ | 16.5 | 87 |
| TiO | 18.0 | 74 |

As shown in Table 1, the SNRm value and the dPW50 value wherein TiO was added were superior to those cases in which $SiO_2$ or $TiO_2$ was added as a simple substance.

Figure 6:
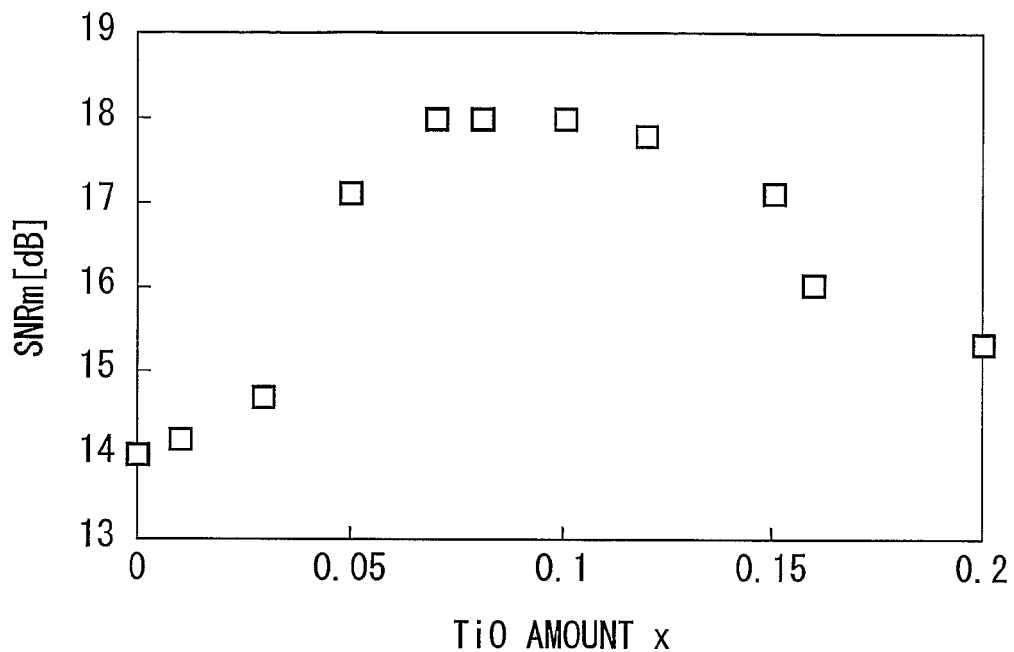
FIG. 6 is a graph which shows the relationship between the SNRm value and the added amount of TiO in Example 1.

A relationship between the SNRm value and the added amount x when TiO was added was shown in FIG. 6. It can be seen that SNRm was preferably improved when the added amount was 5 mol % or more and 15 mok % or less.

Figure 7:
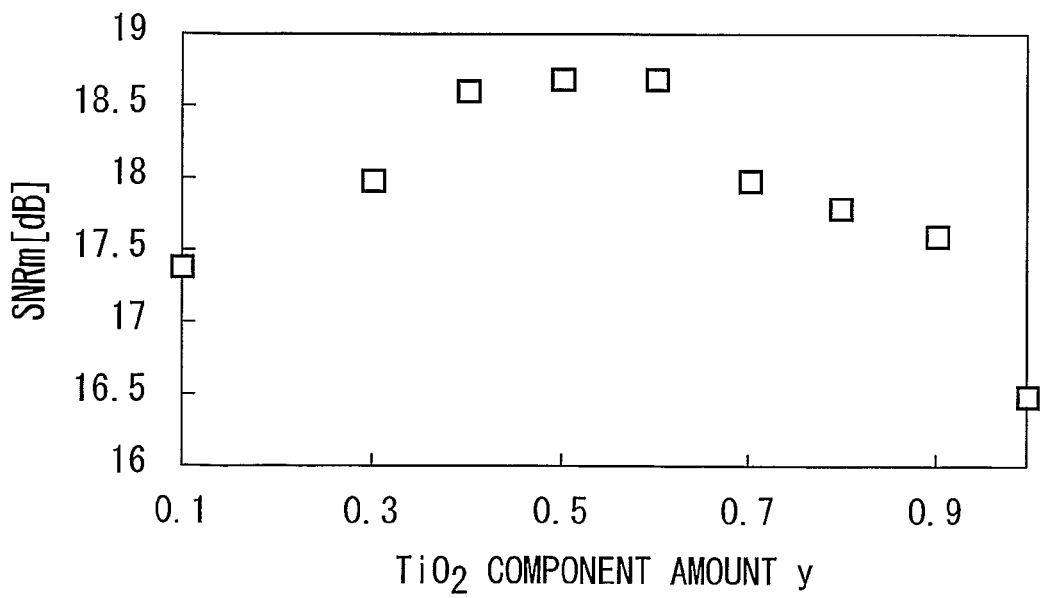
FIG. 7 is a graph which shows the relationship between the SNRm value and the ratio of $TiO_2$ component comprised in Ti oxide in Example 1.

A relationship between "y" and the SNRm value was shown in FIG. 7 wherein the ratio of $(TiO+Ti_2O_3+TiO_2):TiO_2$ was expressed by $(1-y):y$, and the additive material was TiO and x was 0.8. It can be seen that SNRm was preferably improved when y was 0.9 or less.

Furthermore, the fine structure of one portion of the magnetic recording layer, wherein x=0.08, y=0.6, and the additive component was TiO, was observed using TEM. As a result, portions of the magnetic crystal grains and portions of the crystal grain boundary were observed clearly, and it turned out the granular structure in which mother material enclosed the magnetic crystal grains was formed.

Next, the magnetic recording media, wherein x=0.08, y=0.6, and the additive component was TiO and each medium had the combination of various undercoating layers shown in the following Table 2, were produced by the same conditions as described above except that Ru of the second undercoating layer was changed to Rh, Pt, Pd, or Ir respectively, and evaluations were conducted. The SNRm values wherein each undercoating layer was used are shown in Table 2.

TABLE 2

| Second undercoating layer 8 nm | First undercoating layer 15 nm | SNRm (dB) |
|---|---|---|
| Ta | Ru | 18.7 |
| Ta | Rh | 18.5 |
| Ta | Pt | 18.5 |
| Ta | Pd | 18.6 |
| Ta | Ir | 18.0 |

As it apparent from the Table 2, it can be seen that the good SNRm value were obtained even when any undercoating layer was used.

Next, magnetic recording media as shown in FIG. 3, wherein a third undercoating layer was provided between a second undercoating layer and a soft magnetic layer so that the undercoating layer had a three-layered structure, and therefore the media had a combination of various undercoating layers shown in the following Table 3, were produced and evaluated. The SNRm values wherein the added amount x=0.08, y=0.6, and an additive component are TiO were shown in Table 3.

TABLE 3

| Third undercoating layer 8 nm | Second undercoating layer 5 nm | First undercoating layer 15 nm | SNRm (dB) |
|---|---|---|---|
| Ta | Pt | Ru | 19.1 |
| Ta | Pd | Ru | 18.8 |
| Ta | Ir | Ru | 19.0 |
| Ta | Pt | Rh | 18.7 |
| Ta | Pd | Rh | 18.8 |
| Ta | Ir | Rh | 18.6 |

As is apparent from Table 3, it can be seen that any case using any undercoating layer had good SNRm value, and it was preferable.

Example 2

A nonmagnetic glass substrate having a hard disk form and 2.5 inches was prepared.

Next, an inside of a vacuum chamber of a sputtering device was evacuated until $2\times10^{-5}$ Pa or less. Then, the pressure inside of the chamber was made into 0.67 Pa under an atmosphere of Ar, and a soft magnetic layer consisted of $Co_{84}Zr_6Nb_{10}$ and had a thickness of 200 nm and a second undercoating layer consisted of Ta and had a thickness of 8 nm were formed in a similar manner as in the Example 1.

Then, the pressure inside of the chamber was changed to the 3 Pa under an atmosphere of Ar, and a first undercoating layer having a thickness of 15 nm was formed thereon by using a composite target wherein Ru was mixed with any one of $SiO_2$, $Cr_2O_3$, TiO and $TiO_2$.

Next, a magnetic recording layer having a thickness of 13 nm was formed thereon using a composite target wherein 8 mol % of TiO powder was mixed with CoCrPt alloy powder containing 10 at % of Co and 14 at % of Cr. Then, the inside of the vacuum chamber was changed to 0.67 Pa under an atmosphere of Ar, and a protective layer consisting of C and having a thickness of 5 nm was further formed thereon. After the protective layer was formed, a PFPE lubricant was applied to have a thickness of 13 Å (1.3 nm) on the surface of the protective layer with the dipping method.

Input electric power to each target was set to 1,000 W. Composition of the first undercoating layer was changed such that "a" was changed from 0 to 0.2 when the molar ratio of Ru to each oxide was expressed as (1−a):a. The ratio of $TiO_2$ component comprised in Ti oxide in the first under coating layer was expressed by "b", wherein b was expressed with a formula of $(TiO+Ti_2O_3+TiO_2):TiO_2=(1-b):b$, and the b was changed with a method similar to those for the ratio of $TiO_2$ component in the magnetic recording layer of Example 1.

Each characteristic of the produced magnetic recording media were evaluated with methods similar to those of the Example 1. The SNRm value and dPW50 value wherein a=0.09 and each oxide is used are shown in the following Table 4.

TABLE 4

| Second undercoating layer 8 nm | First undercoating layer 15 nm | SNRm (dB) | dPW50 (nm) |
|---|---|---|---|
| Ta | Ru | 18.7 | 72 |
| Ta | Ru—$SiO_2$ | 19.5 | 72 |
| Ta | Ru—$Cr_2O_3$ | 19.3 | 72 |
| Ta | Ru—$TiO_2$ | 19.2 | 73 |
| Ta | Ru—TiO | 19.8 | 70 |

As shown in Table 4, it can be seen that the media including the first undercoating layer, in which any one of $SiO_2$, $Cr_2O_3$, $TiO_2$ and TiO was added, had the SNRm values superior to that of the medium including the first undercoating layer in which only Ru was contained.

Figure 8:
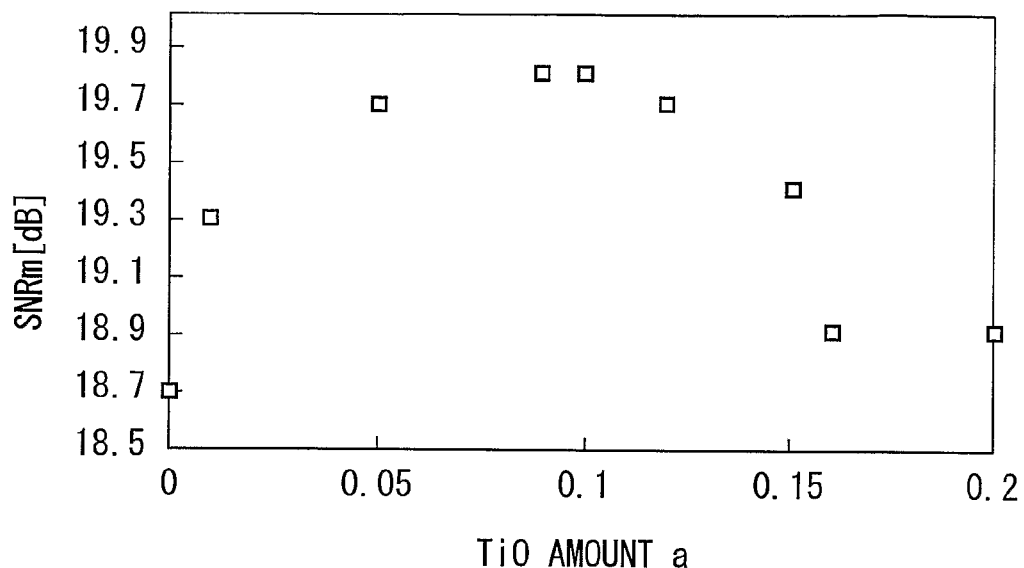
FIG. 8 is a graph which shows the relationship between the SNRm value and the added amount of TiO in Example 2.

A relationship between the additional amount a and a SNRm value is shown in FIG. 8, wherein an additive material added to the first undercoating layer is TiO. It turned out that the SNRm is further improved preferably when the additional amount "a" is in the range of 0.01 to 0.2. The same tendency was also confirmed when the additive material to the first undercoating layer was changed to $SiO_2$, $Cr_2O_3$, or $TiO_2$.

Figure 9:
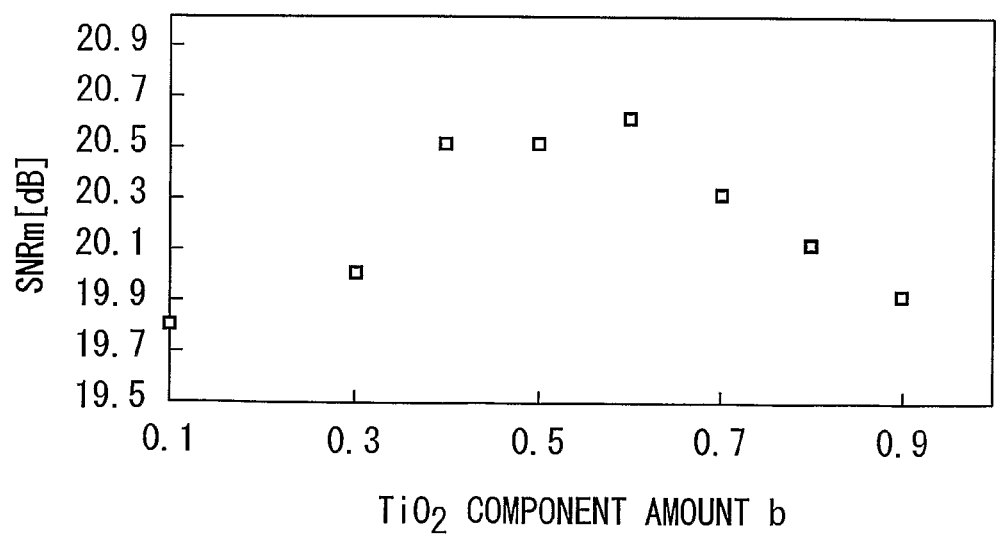
FIG. 9 is a graph which shows the relationship between the SNRm value and the ratio of $TiO_2$ component comprised in Ti oxide in Example 2.

A relationship of the SNRm and the ratio b of $TiO_2$ component, wherein a=0.09 and an additive added to the first undercoating layer was TiO, is shown in FIG. 9. It can be seen that the SNRm was improved preferably when b was 0.9 or less.

Next, the magnetic recording media wherein an additive added to the first undercoating layer thereof was TiO and they had a combination of various undercoating layers shown in Table 5 were produced similar to the aforementioned media except that Rh, Pt, Pd, or Ir was used instead of Ru comprised in the first undercoating layer, and they were evaluated. The SNRm values when the additional amount a=0.09 are shown in Table 5.

TABLE 5

| Second undercoating layer 8 nm | First undercoating layer 15 nm | SNRm (dB) |
|---|---|---|
| Ta | Ru—TiO | 19.8 |
| Ta | Rh—TiO | 19.6 |
| Ta | Pt—TiO | 19.3 |
| Ta | Pd—TiO | 19.3 |
| Ta | Ir—TiO | 19.1 |

As shown in Table 5, it turned out that good SNRm values were obtained preferably even when any undercoating layer was used. Similar tendencies were also confirmed when $SiO_2$, $Cr_2O_3$, or $TiO_2$ was used as an additive to the first undercoating layer.

Next, magnetic recording media which had the combination of various undercoating layers as shown in Table 6, wherein a third undercoating layer was provided between a second undercoating layer and a soft magnetic layer to form three-layered undercoating structure, and evaluations thereof were conducted. The SNRm values, wherein the additional amount a=0.09, and an additive added to the first undercoating layer is TiO, is shown in Table 6.

TABLE 6

| Third undercoating layer 8 nm | Second undercoating layer 5 nm | First under coasting layer 15 nm | SNRm (dB) |
|---|---|---|---|
| Ta | Pt | Ru—TiO | 20.1 |
| Ta | Pd | Ru—TiO | 20.1 |
| Ta | Ir | Ru—TiO | 19.9 |
| Ta | Pt | Rh—TiO | 19.9 |
| Ta | Pd | Rh—TiO | 19.9 |
| Ta | Ir | Rh—TiO | 19.7 |

As shown in Table 6, it can be seen that the good SNRm value was obtained preferably, even when any undercoating layer was used. The same tendency was also seen when $SiO_2$, $Cr_2O_3$, or $TiO_2$ were used as an additive added to the first undercoating layer.

Recording media as shown in FIG. 4 wherein a fourth undercoating layer was provided between a third undercoating layer and a soft magnetic layer to form a four-layered undercoating structure was produced, and evaluations thereof were conducted. Combinations of undercoating layers were determined in accordance with the following Table 7. The SNRm values wherein a=0.09 and an additive to the first undercoating layer is TiO are shown in Table 7.

TABLE 7

| Fourth undercoating layer 8 nm | Third undercoating layer 5 nm | Second undercoating layer 15 nm | First undercoating layer 3 nm | SNRm (dB) |
|---|---|---|---|---|
| Ta | Pt | Ru | Ru—TiO | 21.0 |
| Ta | Pd | Ru | Ru—TiO | 21.0 |

TABLE 7-continued

| Fourth undercoating layer 8 nm | Third undercoating layer 5 nm | Second undercoating layer 15 nm | First undercoating layer 3 nm | SNRm (dB) |
|---|---|---|---|---|
| Ta | Ir | Ru | Ru—TiO | 20.8 |
| Ta | Pt | Rh | Ru—TiO | 20.5 |
| Ta | Pd | Rh | Ru—TiO | 20.5 |
| Ta | Ir | Rh | Ru—TiO | 20.3 |
| Ta | Pt | Ru | Rh—TiO | 20.8 |
| Ta | Pd | Ru | Rh—TiO | 20.8 |
| Ta | Ir | Ru | Rh—TiO | 20.7 |
| Ta | Pt | Rh | Rh—TiO | 20.4 |
| Ta | Pd | Rh | Rh—TiO | 20.3 |
| Ta | Ir | Rh | Rh—TiO | 20.3 |

As shown in Table 7, it can be seen that the good SNRm values were obtained preferably, even when any undercoating layer was used. The same tendency was seen when SiO2, $Cr_2O_3$, or $TiO_2$ was used as an additive to the first undercoating layer.

INDUSTRIAL APPLICABILITY

A magnetic recording medium and a magnetic recording apparatus using the magnetic recording medium are provided by the present invention, and the magnetic recording medium can conduct high density recording and has superior SNR characteristics, and the particle diameter of the magnetic crystal grains is made small without causing distortion of the crystallinity and the orientation of the magnetic crystal grains.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A magnetic recording medium, comprising:
a substrate,
at least one undercoating layer formed on the substrate, and
a magnetic recording layer which is formed on the undercoating layer and includes a magnetic crystal grains and a grain boundary field which encloses the magnetic crystal grain; wherein
the grain boundary field includes Ti oxides, and the ratio of the substance amount of the Ti oxides in the magnetic recording layer is 5 mol % or more and 15 mol % or less,
the Ti oxides comprise $TiO_2$ wherein the ratio of the $TiO_2$ component in the Ti oxides is 40 to 60 mol %, and
the Ti oxides further comprises TiO and/or $Ti_2O_3$.

2. The magnetic recording medium according to claim 1, wherein the magnetic crystal grain comprises Pt and Cr in addition to Co as a main component; and an orientation of a magnetic easy axis of the grain is perpendicular to the substrate.

3. The magnetic recording medium according to claim 1, wherein at least one layer contained in the undercoating layer comprises nonmagnetic crystal grains which contain at least one element selected from the group consisting of Ru, Rh, Pt, and Pd as an main component.

4. The magnetic recording medium according to claim 1, wherein the undercoating layer comprises: nonmagnetic crystal grains, which contains at least one element selected from the group consisting of Ru, Rh, Pt, and Pd as an main component; and a grain boundary field, which encloses the nonmagnetic crystal grains and includes an oxide of at least one element selected from the group consisting of Si, Cr, and Ti.

5. The magnetic recording medium according to claim 1, wherein the undercoating layer contains an oxide and the ratio of the substance amount of the oxide in the undercoating layer is 1 mol % or more and 15 mol % or less.

6. The magnetic recording medium according to claim 1, wherein the undercoating layer contains an oxide and the oxide contained in the undercoating layer is Ti oxide, and the Ti oxide comprises at least one of TiO and $Ti_2O_3$.

7. The magnetic recording medium according to claim 1, wherein the undercoating layer contains Ti oxide and the undercoating layer comprises $TiO_2$ as at least one Ti oxide, and the ratio of the $TiO_2$ in the Ti oxide is 90 mol % or less.

8. A manufacturing method for producing a magnetic recording medium according to claim 1, comprising the steps of:
preparing a substrate on which an undercoating layer is formed; and vapor-depositing a material for magnetic crystal grains and a material comprising at least one of TiO and $Ti_2O_3$ to form a magnetic recording layer which includes magnetic crystal grains and a grain boundary field, which encloses the magnetic crystal grains.

9. The manufacturing method for a magnetic recording medium according to claim 8, wherein the magnetic crystal grains in the magnetic recording layer comprise Pt and Cr in addition to Co as a main component; and an orientation of a magnetic easy axis of the grain is perpendicular to the substrate.

10. The manufacturing method for a magnetic recording medium according to claim 8, wherein at least one layer contained in the undercoating layer includes nonmagnetic crystal grains which contain at least one element selected from the group consisting of Ru, Rh, Pt, and Pd as a main component.

11. The manufacturing method for a magnetic recording medium according to claim 8, wherein at least one layer contained in the undercoating layer comprises: nonmagnetic crystal grains, which contains at least one element selected from the group consisting of Ru, Rh, Pt, and Pd as a main component; and a grain boundary field, which encloses the nonmagnetic crystal grains and includes an oxide of at least one element selected from the group consisting of Si, Cr, and Ti.

12. The manufacturing method of a magnetic recording medium according to claim 8, wherein the ratio of the substance amount of the oxide in the undercoating layer is 1 mol % or more and 15 mol % or less.

13. The manufacturing method of a magnetic recording medium according to claim 8, wherein the oxide contained in the undercoating layer is Ti oxide, and the Ti oxide comprises at least one of TiO and $Ti_2O_3$.

14. The manufacturing method of a magnetic recording medium according to claim 8, wherein the oxide contained in the undercoating layer comprises TiO2 as at least one of the Ti oxide, and the ratio of the TiO2 component in the Ti oxide is 90 mol % or less.

15. A magnetic read and write apparatus comprising a read and write head and the magnetic recording medium according to claim 1.

16. The magnetic read and write apparatus according to claim 15, wherein the read and write head is a single pole type recording head.

* * * * *